United States Patent [19]

Konishi et al.

[11] 3,921,026

[45] Nov. 18, 1975

[54] SOLID STATE DISPLAY APPARATUS

[75] Inventors: Kenichi Konishi, Kyoto; Shohei Fujiwara, Takatsuki, both of Japan

[73] Assignee: Matsushita Electronics Corporation, Kadoma, Japan

[22] Filed: Aug. 20, 1973

[21] Appl. No.: 389,513

[30] Foreign Application Priority Data

Sept. 5, 1972 Japan ................................ 47-89267

[52] U.S. Cl. ................ 313/501; 313/502; 313/510; 313/512; 313/513

[51] Int. Cl.² .................... H01J 63/06; H01L 33/00

[58] Field of Search ........ 313/108 R, 108 B, 108 D, 313/109.5, 114; 317/235 N; 240/1 EL; 250/217 SS

[56] References Cited

UNITED STATES PATENTS

| | | | |
|---|---|---|---|
| 3,501,676 | 3/1970 | Adler et al. | 313/108 R X |
| 3,510,732 | 5/1970 | Amans | 313/501 X |
| 3,529,200 | 9/1970 | Potter et al. | 313/108 |
| 3,593,055 | 7/1971 | Gevsic et al. | 313/108 D |
| 3,763,405 | 10/1973 | Mitsuhata | 317/235 N X |
| 3,774,086 | 11/1973 | Vincent, Jr. | 313/108 D X |

*Primary Examiner*—James W. Lawrence
*Assistant Examiner*—E. R. LaRoche
*Attorney, Agent, or Firm*—Wenderoth, Lind & Ponack

[57] ABSTRACT

In a transparent resin wafer are confined units made up of a light-emitting diode capable of emitting infrared light and a luminescent stick consisting of infrared-excitable luminescent material and transparent resin, and seven of these units are arranged so as to indicate a numeral by seven light segments, so that when specified ones of the light-emitting diodes are lit, the respective sticks or strips combined therewith are excited by infrared light from the light-emitting diodes to indicate a desired numeral. By selecting a suitable luminescent material, any desired color is obtainable.

4 Claims, 4 Drawing Figures

SOLID STATE DISPLAY APPARATUS

BACKGROUND OF THE INVENTION

Hitherto, there has been known an electric light-emitting apparatus comprising several light-emitting diodes embedded in or facing a respective light-guide of transparent resin wafers, the edges of which are so arranged to indicate a letter or a mark when specified ones of them are lit. One example of such apparatus was shown, for instance, in United States Patent 3,555,335. In such prior art, due to its construction which caused the edges of the resin wafers to be seen by the observer, the transparent resin wafer could not be arranged flat on a supporting board, and the color of the light was limited by the characteristic of the light-emitting diode. Generally, the emitted light was red or green. There has been an improvement device made in which an infrared light-emitting diode is covered with a layer of infrared excitable green-light emitting luminescent material, so that the luminescent material emits a green light upon stimulation by the infrared light. In such improved apparatus, however, since the light-emitting face is very small, it is difficult to firmly provide the luminescent material to efficiently convert the infrared light into visible light, and moreover, the size and shape of the light emitting surface is limited by the structure of the light-emitting diode.

SUMMARY OF THE INVENTION

This invention seeks to provide an improved solid-state display apparatus capable of clearly emitting light of a desired color from a luminescent stick of a desired shape and size.

This invention comprises an improved solid-state display apparatus wherein an infrared-emitting diode and a stick comprising infrared-excitable luminescent material and light-conductive resin are embeded at positions spaced from each other in a piece of light-conductive resin, the luminescent stick being so shaped and sized as to clearly indicate a segment of letter or mark when emitting the light.

DETAILED DESCRIPTION OF THE INVENTION

Figures 1, 2:
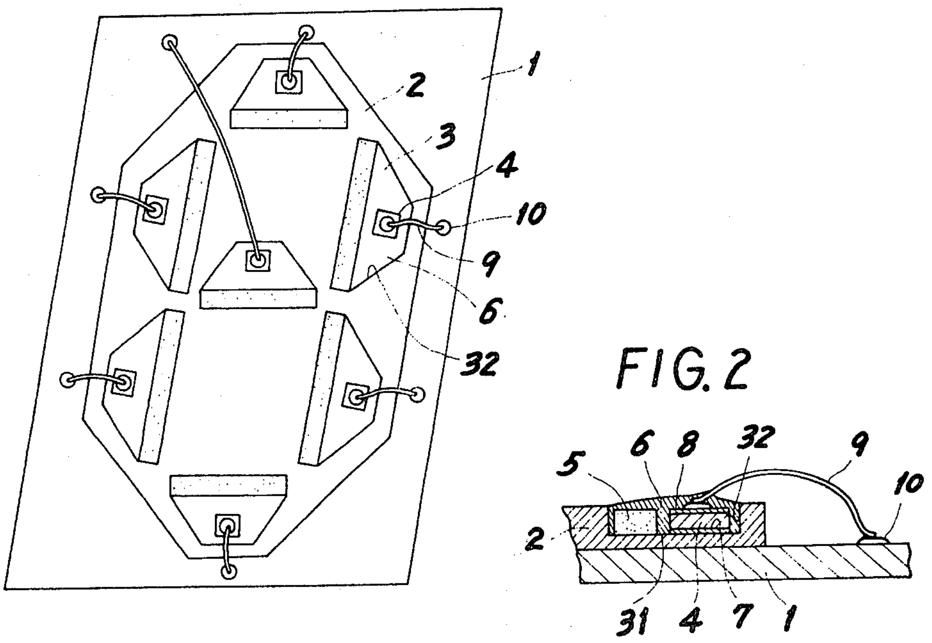
FIG. 1 is a plan view of the apparatus of the present invention.
FIG. 2 is an enlarged sectional side-view of a part of the apparatus of FIG. 1.
Figure 3:
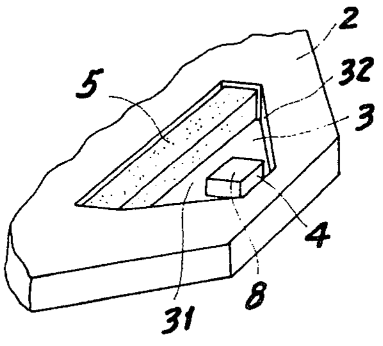
FIG. 3 is an enlarged perspective view of a part of the apparatus of FIG. 1.
Figure 4:
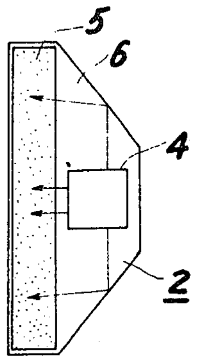
FIG. 4 is an enlarged plan view of a part of the apparatus of FIG. 1.

In the Figures, on a substrate 1 of insulating board, an electrically conductive substrate, for instance, an aluminum substrate 2, is provided by, for instance, bonding. In the face of the aluminum substrate 2 a specified number of recesses 3, are formed in a specified pattern, by, for instance, pressing. The number and the pattern are designed so as to indicate a desired configuration such as numerals or letters; the pattern shown in FIG. 1 is known as a seven-segment pattern for numeral indication. Each recess 3 has a smooth flat bottom surface 31 which is surrounded by vertical smooth side walls 32. In one example, the aluminum substrate 2 is about 0.5mm thick and each recess 3 is about 0.2mm deep. In each recess 3 is one infrared-emitting diode 4 comprised of, for instance, a GaAs (gallium arsenide) semiconductor, 0.4mm by 0.4mm (broad) by 0.2mm (deep) and having a light emitting P-N junction. The lower electrode 7 of diode 4 is bonded to the flat floor 31 with a layer of known electrically conductive bonding material. Also a luminescent stick 5, which is an infrared-excitable luminescent material (namely, infrared to visible conversion phosphor) and light-conductive i.e., transparent or translucent binding resin, for instance, epoxy resin, polyurethane resin, or silicone resin, is placed in the recess, preferably set a point spaced from the diode 4. Infrared-excitable phosphor principally consisting of $LaF_3$;Yb,Er or $YF_3$;Yb,Er can be used for green-emission, infrared-excitable phosphor principally consisting of YOCl;Yb,Er or $Y_3OCl_7$;YbEr can be used for red-emission, and infrared-excitable phosphor principally consisting of $YF_3$;Yb,Tm can be used for blue-emission.

If phosphors with different colors of emission are blended and formed into the stick, almost any desired color of emission is obtainable by selecting the proper composition of the mixture.

The shape of the cross section of the stick 5 may be a circle, an ellipse, a square, a polygon or a very thin quadrangle. Then a wafer 6, tightly contacting the inner faces of the recess 3 and made of light-conductive i.e., transparent or translucent resin, for instance, epoxy resin, polyurethane resin or silicone resin, is formed in the recess 3 by pouring melted resin or unhardened resin into the recess 3, so that the transparent resin wafer 6 surrounds the infrared-emitting diode 4 and the luminescent stick 5.

Thus, the wafer 6 of transparent or translucent resin forms a light-guide, wherein the upper surface and the floor face together form parallel surfaces for conducting light by the "total reflection phenomenon" (German: *Totale Reflexion*; French: *reflexion totale*), and the smooth vertical faces of the wafer 6 which contact the vertical recess walls 32 of metal constitute reflecting mirrors to direct the infrared light towards the luminescent stick 5. Of course, the light emitted by the diode 4 reaches directly to the luminescent stick 5.

Fine connecting wires 9 of, for instance, aluminum or gold connect respective upper electrodes 8 of the infrared-emitting diodes 4 to the connecting tabs 10 on the insulating substrate 1.

The example of FIG. 1 is a seven-segment display for indicating numerals 0, 1, 2, . . . . . 8, 9 for use, for instance, in a desk-top electronic calculator.

In a modified example, the aluminum substrate 2 with the recesses 3 bonded on the insulating board 1 can be replaced by an insulating board with the recesses of similar shapes, a specified part of which board is coated with a vapor-deposited aluminum layer.

For other modified examples, the recesses can have other patterns than the abovementioned seven-segment numeral indicating pattern, so as to indicate other kinds of letters or marks.

Since the electric light-emitting apparatus of the present invention is constituted as described above, when selected ones of the light-emitting diodes 4 are energized to emit infrared rays, the rays emitted from the P-N junctions of the diodes 4 are conducted directly and by reflections at the vertical walls 32 and at both top and floor faces of the transparent resin wafers 6 to the luminescent sticks 5, which are excited and emit a desired visible light from the whole surface thereof, whereby the observer can observe an illuminated letter or mark. Thus, the infrared light emitted from very small areas of the infrared-emitting diodes 4 is converted to visible light of desired color emitted from the whole surfaces of the stick, enabling clear indication of the letter or the mark. Since the rays from the light-emitting diodes 4 are conducted through the thin transparent resin wafers 6 by direct travelling and by the total reflection phenomenon, the rays are efficiently conducted to the luminescent sticks 5, enabling attainment of efficient light conduction and clear indication.

Since visible light is emitted from the surfaces of the luminescent sticks, by desirably shaping and sizing them, indication of a sufficiently large and clear letter or mark is possible with only one small infrared-emitting diode for each segment. The infrared-to-visible light conversions are made efficiently since light conversion is by means of a large luminescent stick.

Also, since the transparent resin wafers 6 containing the light-emitting diodes 4 are laid flatly on the electrically conductive substrate 2, the apparatus has a very simple and rigid construction, thereby ensuring shock-proof characteristics, a small thickness and ease of automated mass-production.

Furthermore, since the lower electrode of the light-emitting diode 4, is directly connected to the conductive substrate 2, it is only the upper electrode that is necessary to be wired and connected to the connecting tab 9 on the insulating substrate 1. Thus wiring of the apparatus is simplified.

What is claimed is:

1. A solid-state display apparatus comprising an electrically conductive substrate having a plurality of recesses in one face thereof, and an insulating substrate on which said conductive substrate is supported, an infrared-emitting diode having electrodes thereon positioned in and secured to the bottom of each of said recesses, one of said electrodes being electrically connected to said bottom, a luminescent stick containing infrared-excitable luminescent material and light-conductive resin positioned in each recess at a position spaced from said infrared-emitting diode, a transparent light-conductive resin wafer in each of said recesses extending from said diode to said luminescent stick and having a flat bottom face, flat side faces and a flat upper surface, said bottom face and said upper surface being parallel to each other, and surrounding said infrared-emitting diode and said luminescent stick and for conducting and reflecting infrared emissions from the diode to the luminescent stick by total reflection, said sticks being positioned on said substrate in a pattern for indicating a desired configuration when lit, a plurality of connecting tabs on said insulating substrate, one for each recess, and a wire connecting the other electrode of each of said infrared-emitting diodes to a corresponding connecting tab.

2. A solid-state display apparatus as claimed in claim 1 in which each recess has a flat bottom and flat smooth side walls, and said transparent light-conductive resin wafer fills each of said recesses with the bottom and side walls of the recess defining the bottom and side surfaces of said resin.

3. A solid-state display apparatus as claimed in claim 1 wherein the infrared-emitting diode comprises a GaAs semiconductor with a P-N junction.

4. A solid-state display apparatus as claimed in claim 1 wherein said luminescent stick is longer than said diode in a direction parallel to the plane of the substrate and perpendicular to the shortest line between said diode and said luminescent stick—has been substituted therefor.

* * * * *